US006975387B2

(12) United States Patent
Mizuno

(10) Patent No.: US 6,975,387 B2
(45) Date of Patent: Dec. 13, 2005

(54) WAVEFRONT ABERRATION MEASURING INSTRUMENT, WAVEFRONT ABERRATION MEASURING METHOD, EXPOSURE APPARATUS, AND METHOD FOR MANUFACTURING MICRO DEVICE

(75) Inventor: Yasushi Mizuno, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/353,593

(22) Filed: Jan. 29, 2003

(65) Prior Publication Data

US 2003/0137654 A1 Jul. 24, 2003

Related U.S. Application Data

(63) Continuation of application No. PCT/JP01/11274, filed on Dec. 21, 2001.

(30) Foreign Application Priority Data

Dec. 22, 2000 (JP) ....................................... 2000-390551

(51) Int. Cl.[7] ................................................... G01J 1/00

(52) U.S. Cl. .................... 356/121; 356/124.5; 356/125; 355/53

(58) Field of Search ................................ 356/121–127, 356/450, 237.4–237.6; 355/30, 50, 53, 55; 250/201.1, 548, 559.3

(56) References Cited

U.S. PATENT DOCUMENTS

| | | | | |
|---|---|---|---|---|
| 4,326,800 A | | 4/1982 | Fitts | 356/152 |
| 4,490,039 A | | 12/1984 | Bruckler et al. | 356/121 |
| 4,932,781 A | | 6/1990 | Kuwayama | 356/357 |
| 5,233,174 A | | 8/1993 | Zmek | 250/201.9 |
| 5,493,391 A | | 2/1996 | Neal et al. | 256/121 |
| 5,539,718 A | | 7/1996 | Hosh et al. | 369/100 |
| 5,610,897 A | | 3/1997 | Yamamoto et al. | 369/124 |
| 5,650,840 A | * | 7/1997 | Taniguchi | 355/55 |
| 5,661,546 A | * | 8/1997 | Taniguchi | 355/53 |
| 5,760,879 A | * | 6/1998 | Shinonaga et al. | 356/399 |
| 5,828,455 A | | 10/1998 | Smith et al. | 356/354 |
| 5,841,520 A | * | 11/1998 | Taniguchi | 355/53 |
| 5,864,381 A | | 1/1999 | Neal et al. | 351/205 |
| 5,898,501 A | | 4/1999 | Suzuki et al. | 356/359 |

(Continued)

FOREIGN PATENT DOCUMENTS

| | | | |
|---|---|---|---|
| EP | 1 079 223 A2 | 2/2001 | G01M/11/02 |
| EP | 1 128 217 A2 | 8/2001 | G03F/7/20 |

(Continued)

OTHER PUBLICATIONS

English translation of Japanses Patent No.2000–340488—Dec. 8, 2000 previously submitted in Information Disclosure Statement dated Jan. 29, 2003.

(Continued)

*Primary Examiner*—Frank G. Font
*Assistant Examiner*—Sang H. Nguyen
(74) *Attorney, Agent, or Firm*—Synnestvedt & Lechner LLP

(57) ABSTRACT

Before measuring a wavefront aberration of a projection optical system, an image formation position of an image of a pattern of a test reticle which is formed on a predetermined surface is detected by an AF sensor. Based on a result of this detection, the position of an incident surface of a wavefront aberration measurement unit is adjusted, and a position of an image of the pattern with respect to the incident surface is adjusted. After this adjustment, the image of the pattern formed through the projection optical system is detected by the wavefront aberration measurement unit, and a wavefront aberration detection section is used to obtain wavefront aberration information of the projection optical system based on a result of this detection.

28 Claims, 7 Drawing Sheets

U.S. PATENT DOCUMENTS

| | | | | | |
|---|---|---|---|---|---|
| 5,912,731 | A | | 6/1999 | DeLong et al. | 356/121 |
| 5,936,720 | A | | 8/1999 | Neal et al. | 356/121 |
| 5,978,085 | A | | 11/1999 | Smith et al. | 356/354 |
| 6,052,180 | A | | 4/2000 | Neal et al. | 356/121 |
| 6,078,380 | A | * | 6/2000 | Taniguchi et al. | 355/52 |
| 6,111,646 | A | * | 8/2000 | Naulleau et al. | 356/494 |
| 6,130,419 | A | | 10/2000 | Neal | 250/201.9 |
| 6,184,974 | B1 | | 2/2001 | Neal et al. | 356/121 |
| 6,278,514 | B1 | | 8/2001 | Ohsaki | 355/55 |
| 6,304,317 | B1 | * | 10/2001 | Taniguchi et al. | 355/55 |
| 6,360,012 | B1 | | 3/2002 | Kreuzer | 382/211 |
| 6,404,482 | B1 | * | 6/2002 | Shiraishi | 355/53 |

FOREIGN PATENT DOCUMENTS

| | | | |
|---|---|---|---|
| JP | 11-297600 | 10/1999 | H01L/21/027 |
| JP | 2000-047103 | 2/2000 | G02B/13/24 |
| JP | 2000-121491 | 4/2000 | G01M/11/00 |
| JP | 2000-277411 | 10/2000 | H01L/21/027 |
| JP | 2000-277412 | 10/2000 | H01L/21/027 |
| JP | 2000-340488 | 12/2000 | H01L/21/027 |
| JP | 2001-230193 | 8/2001 | H01L/21/027 |

OTHER PUBLICATIONS

English translation of Japanses Patent No. 2000–277411—Oct. 6, 2000 previously submitted in Information Disclosure Statement dated Jan. 29, 2003.

English translation of Japanses Patent No. 2000–121491—Apr. 28, 2000 previously submitted in Information Disclosure Statement dated Jan. 29, 2003.

English translation of Japanses Patent No. 2000–047103—Feb. 18, 2000 previously submitted in Information Disclosure Statement dated Jan. 29, 2003.

English translation of Japanses Patent No. 2000–230193—Aug. 24, 2001 previously submitted in Information Disclosure Statement dated Jan. 29, 2003.

* cited by examiner

Fig.5

Polynomial Equation Of Zernike $Q_n(\rho)\rho m(\cos m\Phi+\sin m\Phi)$

| n | m | No. | Polynomial | |
|---|---|---|---|---|
| 0 | 0 | 0 | 1 | |
| 1 | 1 | 1 | $\rho\cos\Phi$ | Image Point Movement |
| | | 2 | $\rho\sin\Phi$ | |
| | 0 | 3 | $2\rho^2-1$ | Focus |
| 2 | 2 | 4 | $\rho^2\cos 2\Phi$ | Tertiary First Order Astigmatism |
| | | 5 | $\rho^2\sin 2\Phi$ | |
| | 1 | 6 | $(3\rho^2-2)\rho\cos\Phi$ | Tertiary Coma Aberration |
| | | 7 | $(3\rho^2-2)\rho\sin\Phi$ | |
| | 0 | 8 | $6\rho^4-6\rho^2+1$ | Quaternary Spherical Aberration |
| 3 | 3 | 9 | $\rho^3\cos 3\Phi$ | |
| . | . | . | . | |
| . | . | . | . | |
| . | . | . | . | |
| . | . | . | . | |

WAVEFRONT ABERRATION MEASURING INSTRUMENT, WAVEFRONT ABERRATION MEASURING METHOD, EXPOSURE APPARATUS, AND METHOD FOR MANUFACTURING MICRO DEVICE

RELATED APPLICATION

This application is a continuation of PCT application number PCT/JP01/11274 filed on Dec. 21, 2001.

BACKGROUND OF THE INVENTION

The present invention relates to a wavefront aberration measuring instrument for measuring a wavefront aberration of a target optical system such as a projection optical system in an exposure apparatus used in a photolithography step in a manufacturing process of a micro device such as a semiconductor element, a liquid crystal display element device, an image pickup element or a thin-film magnetic head, a wavefront aberration measuring method, an exposure apparatus having the wavefront aberration measuring instrument, and a method for manufacturing the above-described micro device.

There has been conventionally known an exposure apparatus which illuminates an image of a pattern formed on a mask, such as a reticle or a photo mask, with exposure light and transfers the image of the pattern onto a substrate such as a wafer or a glass plate on which a photosensitive material such as a photoresist is applied through a projection optical system.

In recent years, integration of semiconductor elements has become increasingly higher, and a demand for realization of the finer circuit pattern is increasing. In order to meet this demand for realization of the finer circuit pattern, there has been developed an exposure apparatus using a far ultraviolet ray with a shorter wavelength, for example, pulse light such as a KrF excimer laser beam ($\lambda$=248 nm), an ArF excimer laser beam ($\lambda$=193 nm) or an $F_2$ laser beam ($\lambda$=157 nm).

Further, in order to meet the demand for the finer circuit pattern, aberration measurement of the projection optical system is carried out for the purpose of optimization of an image formation performance of the projection optical system. Aberration measurement of the projection optical system is carried out as follows, for example. That is, a mask for aberration measurement is arranged on a surface of an object, an image of a predetermined pattern formed on the mask is baked on the substrate arranged on the image surface of the projection optical system, and the baked image is developed. Then, a magnifying power, a degree of asymmetry property or the like of the developed image is measured by using a scanning electron microscope (SEM), and an aberration of the projection optical system is obtained based on the measurement result.

However, the prior art method has a problem that the accuracy of measuring the aberration can not be sufficiently assured due to a manufacturing error of a pattern of the mask for aberration measurement, irregularities of application of the photoresist, a processing error of development unevenness or the like. Further, in observation using the SEM, a predetermined pretreatment for the substrate, for example, a development process or the like of the substrate is required, and it takes a long time for measuring the aberration.

In order to avoid such a problem, there is considered a method of measuring the aberration of the projection optical system as a wavefront aberration based on, for example, Shack-Hartmann system. In this system, spot light which is image-formed on an image forming surface of the projection optical system is converted into a parallel beam by a collimator lens. Then, the parallel beam is caused to enter a micro lens array having many lenses two-dimensionally arranged. As a result, the parallel beam is image-formed on an image pickup element arranged at a predetermined position for each lens.

Here, when no aberration exists in the projection optical system, each lens of the micro lens array forms an image of the incident light flux on an optical axis of each lens since the parallel beam entering the micro lens array has a parallel wavefront.

On the other hand, when the aberration exists in the projection optical system, the parallel beam has an inclination of the wavefront which differs from lens to lens since the parallel beam entering the micro lens array has a distorted wavefront according to the aberration. Furthermore, the light flux which has entered each lens of the micro lens array is image-formed at a position deviating from the optical axis in accordance with an amount of inclination of the wavefront for each lens. The inclination of the wavefront can be obtained from the image formation position for each lens.

However, in the prior art method, the wavefront aberration measurement unit including the collimator lens, the micro lens array and the image pickup element is arranged at, for example, a predetermined position on a substrate stage which supports the substrate, and the wavefront aberration of the projection optical system is measured by using this wavefront aberration measurement unit in this state. At that moment, a detection surface of the wavefront aberration measurement unit must be arranged in the image formation surface of the projection optical system.

If the detection surface is not arranged in the image formation surface of the projection optical system, not only a defocus component is increased but the accuracy of other aberration components may be possibly decreased when wavefront aberration information obtained by measurement using the wavefront aberration measurement unit is developed to various kids of aberration components by using, for example, a polynomial equation of Zernike.

SUMMARY OF THE INVENTION

The present invention has been achieved paying attention to such problems existing in the prior art. It is an object of the present invention to provide a wavefront aberration measuring instrument and a wavefront aberration measuring method which can accurately measure a wavefront aberration of a target optical system such as a projection optical system. Moreover, it is another object of the present invention to provide an exposure apparatus which can accurately measure a wavefront aberration of a projection optical system and improve exposure accuracy, and a method for manufacturing a micro device by which a micro device can be highly accurately manufactured.

To achieve the object described above, according to one aspect of the present invention, there is provided a wavefront aberration measuring instrument including a pattern image detection mechanism which detects an image of a pattern which is formed on a predetermined surface through a target optical system; and a wavefront aberration calculation mechanism which obtains wavefront aberration information of the target optical system based on the detected image of the pattern. The wavefront aberration measuring instrument is characterized by an image formation state detection mechanism which detects an image formation state of an image of the pattern relative to the predetermined surface; and an adjustment mechanism which adjusts a relative position between the predetermined surface and the image of the pattern based on the detected image formation state.

According to an embodiment of the present invention, there is provided a wavefront aberration measuring instrument including a pattern image detection mechanism which detects an image of a pattern which is formed through a target optical system; and a wavefront aberration calculation mechanism which obtains wavefront aberration information of the target optical system based on the detected image of the pattern. The wavefront aberration measuring instrument is characterized by an calculator which develops the wavefront aberration information by using a Zernike polynomial equation and calculates a defocus component; and an adjustment mechanism which adjusts a relative position between the predetermined surface and the image of the pattern based on the defocus component calculated by the calculator.

According to another aspect of the present invention, there is provided a wavefront aberration measuring method by which an image of a pattern which is formed on a predetermined surface through a target optical system is detected and wavefront aberration information of the target optical system is obtained based on the detected image of the pattern. This measuring method is characterized by detecting an image formation state of the image of the pattern relative to the predetermined surface; adjusting a relative position between the predetermined surface and the image of the pattern based on the detected image formation state; and obtaining the wavefront aberration information of the target optical system after adjusting the relative positions of the predetermined surface and the image of the pattern.

The wavefront aberration measuring method according to an embodiment of the present invention calculates a defocus component by developing the wavefront aberration information by using the Zernike polynomial equation and adjusts the relative positions of the predetermined surface and the image of the pattern based on the defocus component.

Other aspects and advantages of the present invention will become apparent from the following description, taken in conjunction with the accompanying drawings, illustrating by way of example the principles of the invention.

BRIEF DESCRIPTION OF DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

FIG. 4(*b*) is an explanatory view of a measurement state of a wavefront aberration in the wavefront aberration measurement unit when an aberration exists in the projection optical system;

FIG. 5 is an explanatory view of development of an aberration component by the Zernike polynomial equation;

DETAILED DESCRIPTION OF THE PREFERRED EMBODIMENTS

A first embodiment according to the present invention in an exposure apparatus which is of a scanning exposure type for manufacturing a semiconductor element will now be described below with reference to FIGS. 1 to 4.

A schematic structure of the exposure apparatus will be first explained.

Figure 1:
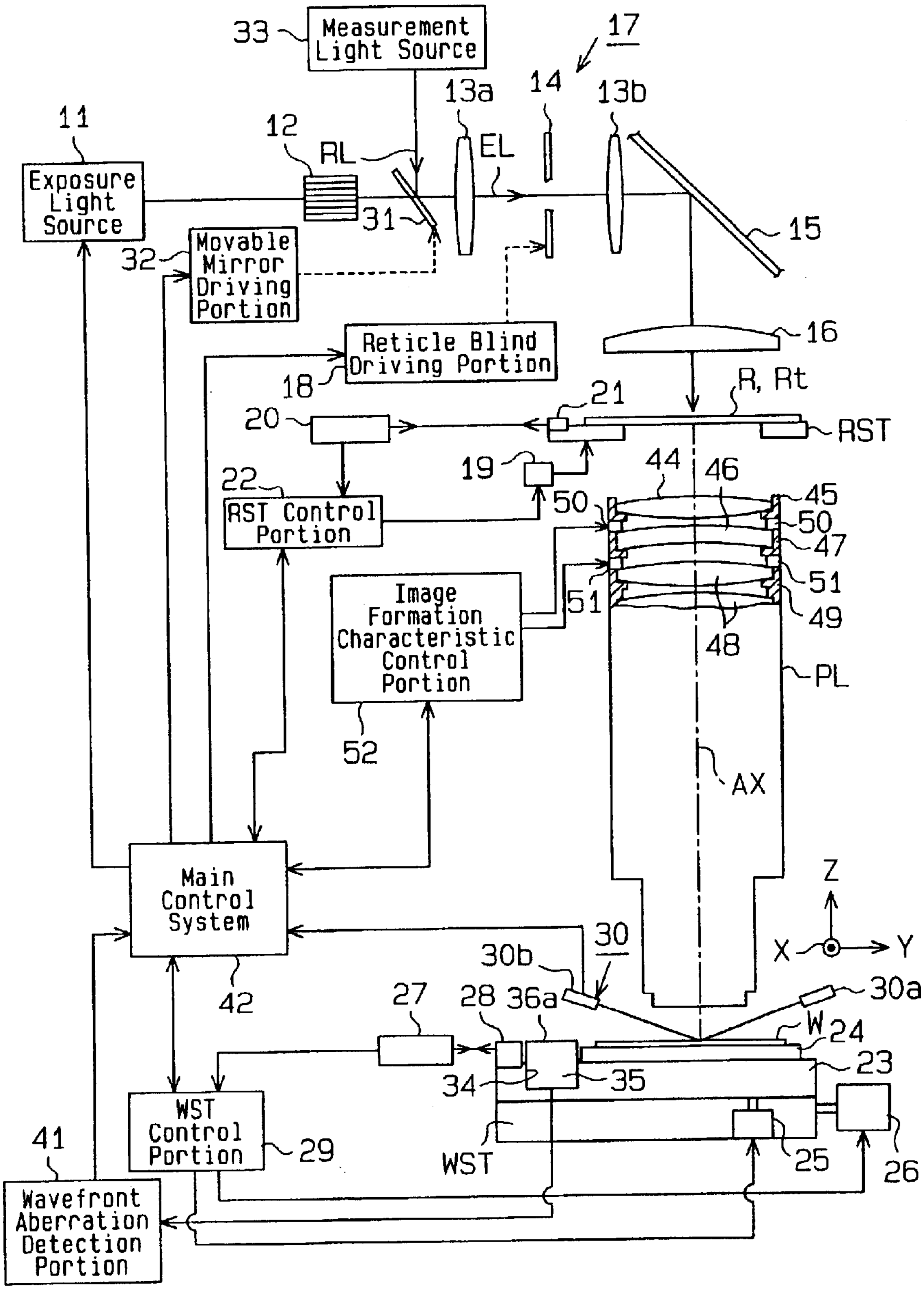
FIG. 1 is a schematic constitutional diagram showing a first embodiment of an exposure apparatus according to the present invention.

As shown in FIG. 1, an exposure light source 11 emits pulse exposure light EL, such as KrF excimer laser beam, ArF excimer laser beam, or $F_2$ laser beam. The exposure light EL enters, for example, a fly-eye lens 12 consisting of many lens elements as an optical integrator, and many secondary light source images corresponding to the respective lens elements are formed on an emission surface of the fly-eye lens 12. It is to be noted that a rod lens may be adopted as the optical integrator. The exposure light EL emitted from the fly-eye lens 12 enters a reticle R as a mask mounted on a reticle stage RST through relay lenses 13*a* and 13*b*, a reticle blind 14, a mirror 15 and a condenser lens 16. A circuit pattern or the like of, for example, a semiconductor element is formed on a pattern surface of the reticle R.

Here, a synthetic system consisting of the fly-eye lens 12, the relay lenses 13*a* and 13*b*, the mirror 15 and the condenser lens 16 constitutes an illumination optical system 17 which superposes the secondary light source images on the reticle R and illuminates the reticle R with the uniform illumination. The reticle blind 14 is arranged so as to achieve the relationship that its light shielding surface is conjugated with a pattern area of the reticle R. The reticle blind 14 consists of a plurality of movable light shielding portions (for example, two L-shaped movable light shielding portions) which can be opened/closed by a reticle blind driving section 18. In addition, an illumination area which illuminates the reticle R can be arbitrarily set by adjusting the size of the open portion (slit width or the like) formed by these movable light shielding portions.

The reticle stage RST can be moved in a predetermined direction (scanning direction (direction Y)) by a reticle stage driving section 19 constituted by a linear motor or the like. The reticle stage RST has a movement stroke which allows the entire surface of the reticle R to come across at least an optical axis AX of the exposure light EL. Incidentally, in FIG. 1, it is determined that a direction along the optical axis AX of a projection optical system PL to be described later is a direction Z, a direction orthogonal to the optical axis of the projection optical system PL and the paper surface is a direction X, and a direction which is orthogonal to the optical axis of the projection optical system PL and parallel to the paper surface is a direction Y. Additionally, the reticle stage RST holds the reticle R so as to allow the micro-motion in the direction X vertical to the scanning direction and the micro-rotation around the optical axis AX in a flat surface vertical to the optical axis AX of the exposure light EL.

A movement mirror 21 which reflects a laser beam from an interferometer 20 is fixed to the end portion of the reticle stage RST. The interferometer 20 constantly detects the position of the reticle stage RST in the scanning direction, and information of such position is transmitted to a reticle stage control section 22. The reticle stage control section 22 controls the reticle stage driving section 19 based on the positional information of the reticle stage RST and moves the reticle stage RST.

The exposure light EL passed through the reticle R enters, for example, the projection optical system PL whose both sides are telecentric. The projection optical system PL forms a projection image obtained by reducing the circuit pattern on the reticle R to, for example, ⅕ or ¼ onto a wafer W as a substrate on which a photoresist having the photosensitivity relative to the exposure light EL is applied on the surface thereof.

This wafer W is held on a wafer stage WST through a Z stage 23 and a wafer holder 24. The Z stage 23 can be inclined in an arbitrary direction with respect to an optimum image formation surface of the projection optical system PL and slightly move in the direction of the optical axis AX (direction Z) of the projection optical system PL by a Z stage driving section 25 including a motor or the like. Further, the wafer stage WST is also configured to be movable in a direction vertical to the scanning direction (direction X) by a wafer stage driving section 26 as a motor so that it can arbitrarily move to a plurality of shot areas partitioned on the wafer, as well as in the scanning direction (direction Y). This enables the step-and-scan operation which repeats scanning exposure for each shot area on the wafer W.

A movement mirror 28 which reflects the laser beam from the interferometer 27 is fixed to the end portion of the wafer stage WST, and the position of the wafer stage WST in the direction X and the direction Y is constantly detected by the interferometer 27. The positional information of the wafer stage WST (or speed information) is transmitted to the wafer stage control section 29, and the wafer stage control section 29 controls the wafer stage driving section 26 based on this positional information (or speed information).

A so-called oblique light incidence optical type focal position detection system (hereinafter referred to as an AF sensor) 30 as an auto focus mechanism which can detect the position of the wafer holder 24 in the direction Z is arranged above the wafer stage WST so as to sandwich the projection optical system PL from the right and left sides. This AF sensor 30 is constituted by a light projection system **30*a* which emits the illumination light having the non-photosensitivity onto the surface of the wafer W from the obliquely upper position through a slit having a predetermined shape and a light receiving system 30*b* which receives the image formation light of an image reflected from the wafer W of a projection image based on that illumination. The AF sensor 30 is previously calibrated so as to detect a best focusing position on an optimum image forming surface of the projection optical system PL. Furthermore, the positional information from the AF sensor 30 is transmitted to a main control system 42 which will be described later, and the main control system 42 controls the Z stage driving section 25 through the wafer stage control section 29 based on the positional information. As a result, the Z stage 23 is moved in the direction Z, and the surface of the wafer W is arranged at the best focusing position which coincides with the image forming surface of the projection optical system PL. It is to be noted that a multipoint AF sensor which illuminates a plurality of slits instead of the slit having a predetermined shape may be used as the AF sensor 30**.

Here, in case of scanning and exposing the circuit pattern on the reticle R in a shot area on the wafer W in the step-and-scan mode, the illuminated area on the reticle R is formed into a rectangular (slit) shape by the reticle blind 14. This illuminated area has a longitudinal direction in a direction orthogonal to the scanning direction (direction+Y) on the reticle R side. Further, the circuit pattern on the reticle R is sequentially illuminated from one end side toward the other end side in the slit-like illuminated area by scanning the reticle R at a predetermined velocity Vr during exposure. As a result, the circuit pattern on the reticle R in the illuminated area is projected onto the wafer W through the projection optical system PL, thereby forming the projection area.

Here, since the wafer W has the inverted image formation relationship with respect to the reticle R, the wafer W is scanned in a direction (direction−Y) opposite to the scanning direction of the reticle R at a predetermined velocity Vw in synchronization with scanning of the reticle R. As a result, the entire shot area of the wafer W can be exposed. The ratio Vw/Vr of the scanning velocity accurately corresponds to the reducing power of the projection optical system PL, and the circuit pattern on the reticle R is accurately reduced and transferred onto each shot area on the wafer W.

Description will now be given of a structure for measuring the wavefront aberration of the projection optical system PL as the target optical system.

As shown in FIG. 1, a movable mirror 31 is arranged between the fly-eye lens 12 and the relay lens **13*a* in the illumination optical system 17 so as to be capable of moving into/from the optical path of the exposure light EL by a movable mirror driving section 32. In the vicinity of the movable mirror 31 is arranged a measurement light source 33 which emits continuous light having a wavelength which substantially matches with that of the exposure light EL as the measurement light RL. This measurement light source 33** is set in such a manner that the peak power of its output is smaller than that of the exposure light EL.

The movable mirror 31 is moved into and arranged in the optical path of the exposure light EL when measuring the aberration of the projection optical system PL, reflects the measurement light RL emitted from the measurement light source 33, and causes the measurement light RL to enter the projection optical system PL from the illumination optical system 17. On the other hand, during exposure, the movable mirror 31 is moved and arranged away from the optical path of the exposure light EL so that irradiation of the exposure light EL onto the reticle R is not inhibited.

As the continuous light, a higher harmonic wave is used, which is obtained by amplifying the single wavelength laser beam in the infrared band or the visible band emitted from, for example, a DFB semiconductor laser or a fiber laser by using a fiber amplifier having, for example, erbium (or both erbium and ytterbium) doped and performing wavelength conversion to obtain the ultraviolet light by using a nonlinear optical crystal.

For example, assuming that the exposure light EL is the ArF excimer laser beam ($\lambda$=193 nm), it is preferred to determine as the measurement light RL the eight-fold higher harmonic wave in a range of 189 to 199 nm which is outputted when the oscillation wavelength of the single wavelength laser falls in a range of 1.51 to 1.59 $\mu$m. Further, since the wavelength of the eight-fold higher harmonic wave in a range of 193 to 194 nm which is output by narrowing the oscillation wavelength to a range of 1.544 to 1.533 $\mu$m substantially coincides with that of the ArF excimer laser beam, it is further preferable to set this higher harmonic wave as the measurement light RL.

As shown in FIG. 1, an attachment concave portion 34 is formed at the Z stage 23 on the wafer stage WST, and a wavefront aberration measurement unit 35 as a pattern image detection mechanism for detecting a wavefront aberration of the projection optical system PL is removably attached to the attachment concave portion 34. This wavefront aberration measurement unit 35 has a detection surface (incident surface on which the light which has passed through the projection optical system PL is incident) 36*a* opposed to the projection optical system PL, and is arranged in such a manner that the height of the incident surface 36*a* substantially coincides with the height of the surface of the wafer W.

Figure 2:
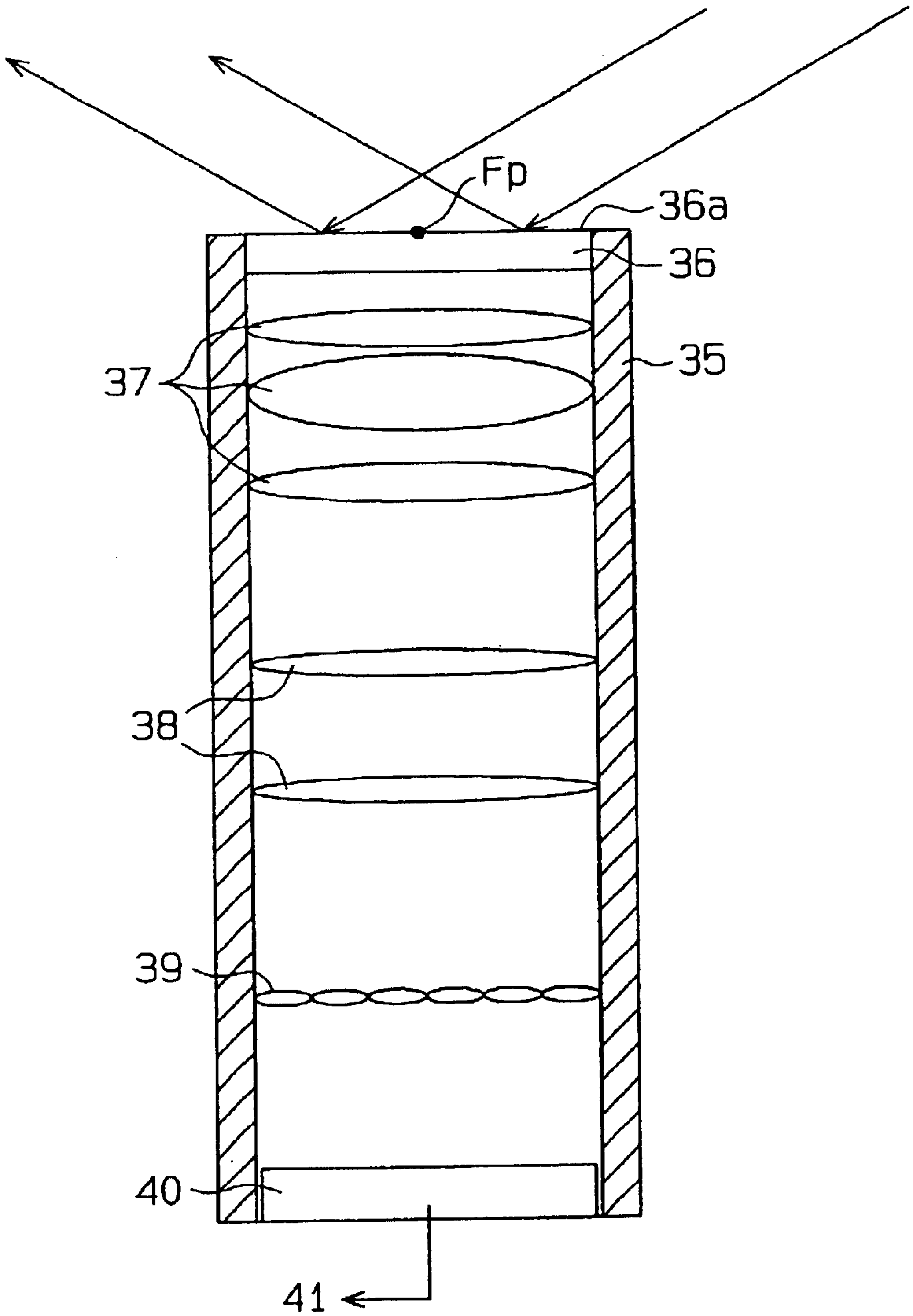
FIG. 2 is a cross-sectional view showing the internal structure of a wavefront aberration measurement unit illustrated in FIG. 1.

As shown in FIG. 2, a collimator lens system 37, a relay lens system 38, a micro lens array 39, and an image pickup element (CCD) 40 as a light receiving mechanism are provided inside the wavefront aberration measurement unit 35. The collimator lens system 37 converts the light flux entering the wavefront aberration measurement unit 35 from the object lens 36 having the incident surface 36*a* formed thereon into a parallel beam PB. The object lens 36 and the collimator lens system 37 constitute the object optical system. In the object lens 36, a lens (optical element) surface opposed to the projection optical system PL is substantially formed to be a flat surface. This flat surface forms the incident surface 36*a*, and the incident surface 36*a* is arranged so as to substantially correspond to the image forming surface of the projection optical system PL. Furthermore, a focal position Fp of the collimator lens system 37 on the projection optical system PL side is set so as to be positioned on the incident surface 36*a*.

The micro lens array 39 has a micro lens two-dimensionally arranged in the surface orthogonal to the optical axis of the parallel beam, divides the parallel beam PB into a plurality of light fluxes, and condenses the divided light fluxes onto the CCD 40 for each lens. The CCD 40 detects a position (image forming position) of the condensing point for each lens. Moreover, the CCD 40 outputs a signal for the position of each condensing point of the received light to the wavefront aberration detection section 41.

This wavefront aberration detection section 41 calculates a wavefront aberration of the projection optical system PL based on the input information of each condensing point, and outputs information concerning the calculated wavefront aberration to a main control system which controls the operation of the entire exposure apparatus. In this manner, the wavefront aberration calculation mechanism is constituted by the wavefront aberration detection section 41.

In addition, in this embodiment, an image formation state detection mechanism is constituted by the AF sensor 30. Additionally, before measuring the wavefront aberration of the projection optical system PL in the wavefront aberration measurement unit 35, the AF sensor 30 is used to detect the position of the incident surface 36*a* of the wavefront aberration measurement unit 35 with respect to the image forming surface of the projection optical system PL. As a result, an image forming state of an image of the pattern is detected (although the detail of the image of the pattern will be described later, the image of the pattern herein means a pin hole pattern arranged in an object surface of the projection optical system PL) with respect to the incident surface 36*a* of the wavefront aberration measurement unit 35. Further, in this embodiment, an adjustment mechanism is constituted by the Z stage driving section 25, and the Z stage 23 is moved in the direction Z based on a detection result from the AF sensor 30, thereby adjusting the incident surface 36*a* of the wavefront aberration measurement unit 35 with respect to the image forming surface of the projection optical system PL.

The structure for correcting the aberration of the projection optical system PL will now be described.

As shown in FIG. 1, in the projection optical system PL, a lens element 44 in a first group which is the closest to the reticle R is fixed to a first support member 45, and a lens element 46 in a second group is fixed to a second support member 47. A lens element 48 located below the lens element 46 in the second group is fixed to a mirror-barrel portion 49. The first support member 45 is connected to the second support member 47 by a plurality of (three for example, and two are shown in FIG. 1) extensible first drive elements 50. The second support member 47 is connected to the mirror-barrel portion 49 by a plurality of extensible second drive elements 51. The respective drive elements 50 and 51 are connected to an image formation characteristic control section 52.

Here, the main control system 42 instructs the image formation characteristic control section 52 to drive the respective drive elements 50 and 51 based on information of the wavefront aberration of the projection optical system PL input from the wavefront aberration detection section 41. As a result, the relative position of the respective lens elements 44 and 46 is changed, and the image formation characteristic of the projection optical system PL is corrected.

Description will now be given of a method for measuring the wavefront aberration of the projection optical system PL.

The above-described wavefront aberration measurement unit 35 is first attached to the attachment concave portion 34 formed in the Z stage 23 on the wafer stage WST. Then, the wafer stage WST is moved in the direction Y by the wafer stage driving section 26 so that the incident surface 36*a* of the wavefront aberration measurement unit 35 is faced to the optical element which constitutes the projection optical system PL and is positioned the closest to the image forming side. In this state, the slit light is projected onto the incident surface 36*a* from the light projection system 30*a* of the AF sensor 30, and the reflected light from the incident surface 36*a* is received by the light receiving system 30*b*. As a result, detection is conducted for a displacement of the incident surface 36*a* from the image forming surface of the projection optical system PL (an image forming state of the image of the pattern relative to the incident surface 36*a*, or a position of the incident surface 36*a* in the direction of the optical axis of the projection optical system PL). The detection information from the AF sensor 30 is transmitted to the main control system 42, and the main control system 42 moves the Z stage 23 in the direction Z in order to adjust the position of the incident surface 36*a* of the wavefront aberration measurement unit 35 relative to the image forming surface of the projection optical system PL.

Figure 3:
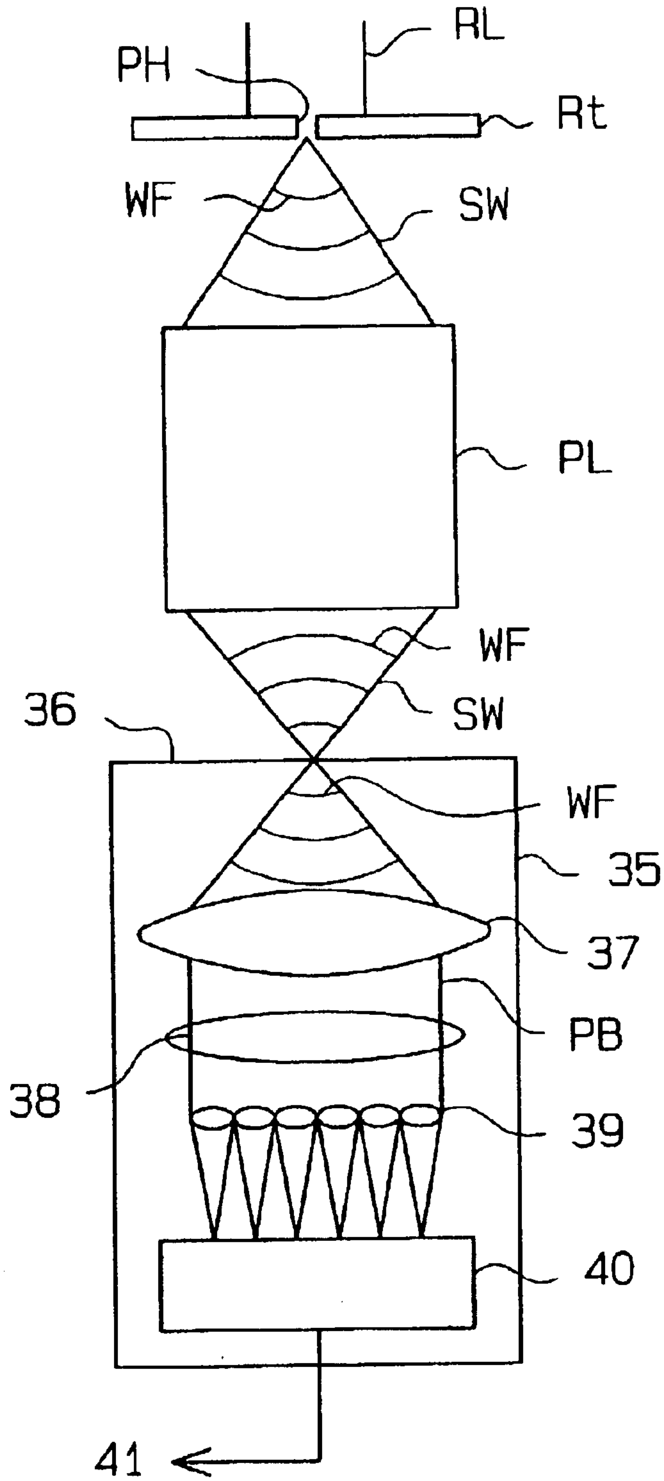
FIG. 3 is an explanatory view of a method for measuring a wavefront aberration by the wavefront aberration measurement unit depicted in FIG. 1.
Figure 4A:
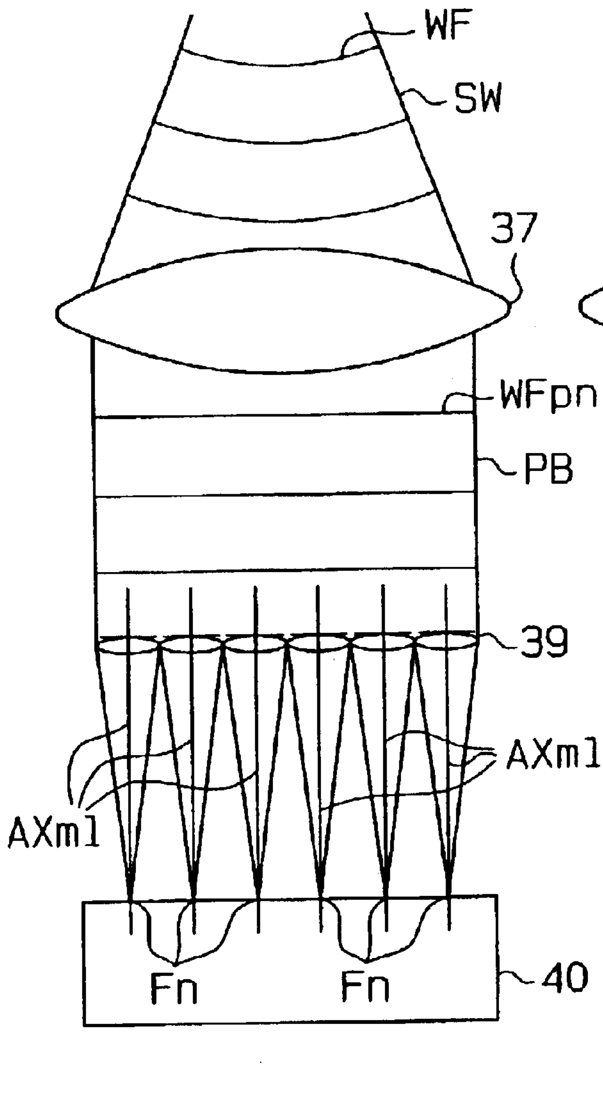
FIG. 4(*a*) is an explanatory view of a measurement state of a wavefront aberration in the wavefront aberration measurement unit when an aberration does not exist in a projection optical system.
Figure 4B:
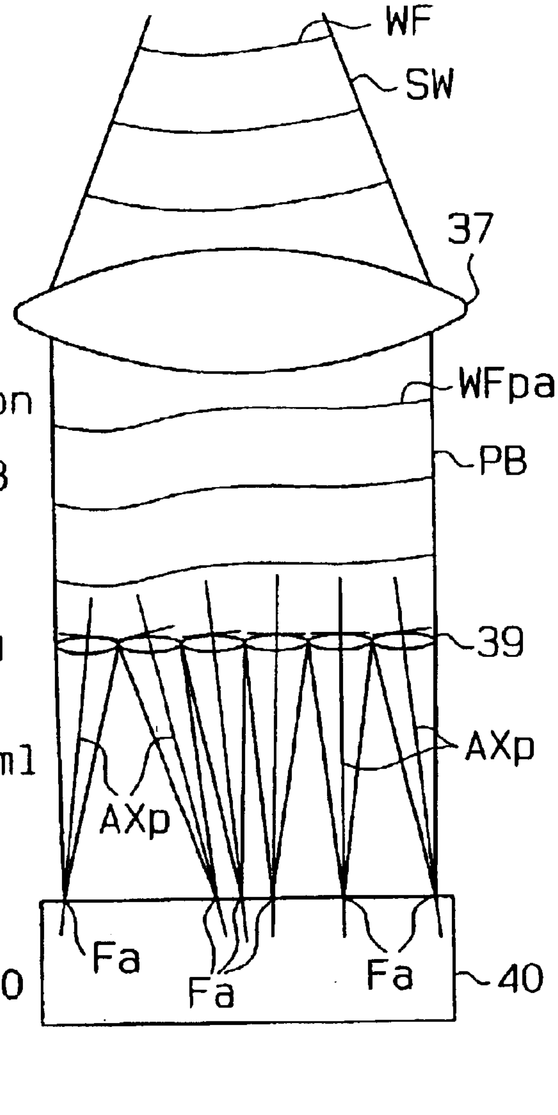

Then, a test reticle Rt having a pin hole PH having a predetermined diameter formed therein is mounted on the reticle stage RST. Subsequently, the movable mirror 31 is moved and arranged in the optical path of the exposure light EL by the movable mirror driving section 32. In this state, the measurement light RL is emitted from the measurement light source 33, and the pin hole PH is irradiated with the measurement light RL through the movable mirror 31, the relay lenses 13*a* and 13*b*, the mirror 15 and the condenser lens 16. As shown in FIG. 3, the measurement light RL is converted into a spherical wave SW by being transmitted through the pin hole PH. The spherical wave SW enters the projection optical system PL, and a distortion is generated in the wavefront WF of the spherical wave SW when the aberration remains in the projection optical system PL. The spherical wave SW emitted from the projection optical system PL forms an image on the incident surface 36*a* of the wavefront aberration measurement unit 35 held on the wafer stage WST, and then enters the inside of the wavefront aberration measurement unit 35. The spherical wave SW which has entered the inside of the wavefront aberration measurement unit 35 is converted into the parallel beam PB by the collimator lens system 37. Here, as shown in FIG. 4(*a*), if no aberration exists in the projection optical system PL, the wavefront WFpn of the parallel beam PB is a flat surface. On the other hand, as shown in FIG. 4(*b*), if the aberration exists in the projection optical system PL, the wavefront WFpa of the parallel beam PB is a distorted surface.

The parallel beam PB is divided into a plurality of light fluxes by the micro lens array 39 and condensed on the CCD 40. Here, as shown in FIG. 4(*a*), if no aberration exists in the projection optical system PL, the wavefront WFpn of the parallel beam PB is a flat surface, and hence the parallel beam PB becomes incident along the optical axis AXml of each lens. Therefore, a condensing spot position Fn for each lens exists on the optical axis AXml of each lens.

On the other hand, as shown in FIG. 4(*b*), if the aberration exists in the projection optical system PL, the wavefront WFpa of the parallel beam PB is a distorted surface. Therefore, the parallel beam PB entering each lens has an inclination of the wavefront which differs from lens to lens. Due to this, a condensing spot position Fa for each lens exists on a perpendicular line AXp relative to the inclination of the wavefront, and it is displaced from the condensing spot position Fn in case of absence of the aberration. Each condensing spot position Fa is detected by the CCD 40.

Subsequently, in the wavefront aberration detection section 41, each condensing spot position Fn in a case where no aberration existing in the projection optical system PL which is previously given in view of design is compared with a detection result of each condensing spot position Fa of the light flux in the CCD 40, light flux of which has been transmitted through the projection optical system PL as a measurement target and condensed through the collimator lens system 37, the relay lens system 38 an the micro lens array 39. Based on this comparison result, an amount of displacement of the condensing spot position Fa of each lens relative to the condensing spot position Fn is obtained, thereby calculating the wavefront aberration information in the projection optical system PL.

In this case, in the above-mentioned embodiment, the displacement of the incident surface 36*a* of the wavefront aberration measurement unit 35 relative to the image forming surface of the projection optical system PL is detected by the AF sensor 30 provided in the exposure apparatus main body. Therefore, in the wafer stage WST, even if the wavefront aberration measurement unit 35 is set in such a manner that the height of the incident surface 36*a* does not coincide with that of the surface of the wafer W, the incident surface 36 can be accurately positioned on the image forming surface of the projection optical system PL. Accordingly, the incident surface 36*a* of the wavefront aberration measurement unit 35 can be caused to substantially coincide with the image forming surface of the projection optical system PL. As a result, when the information of the wavefront aberration measured in the wavefront aberration measurement unit 35 is developed into various aberration components based on the polynomial equation of Zernike, other aberration components, i.e., image point movement, an astigmatism, a coma aberration, a spherical aberration or the like can be measured with the defocus components kept small. Furthermore, the image formation characteristic of the projection optical system PL can be accurately corrected based on the thus obtained wavefront aberration information.

Therefore, according to the present embodiment, the following advantages can be obtained.

(1) In the wavefront aberration measurement apparatus of the projection optical system, before measuring the wavefront aberration of the projection optical system PL, the position of the incident surface 36*a* of the wavefront aberration measurement unit 35 relative to the image forming surface of the projection optical system PL is detected by the AF sensor 30. Moreover, based on this detection result, the position of the incident surface 36*a* of the wavefront aberration measurement unit 35 relative to the image forming surface of the projection optical system PL is adjusted. Thereafter, an image of the pattern formed through the projection optical system PL is detected by the wavefront aberration measurement unit 35, and the wavefront aberration information of the projection optical system PL is obtained by the wavefront aberration detection section 41 based on the detected image of the pattern. Therefore, the wavefront aberration of the projection optical system PL can be further accurately measured based on the image of the pattern of the test reticle Rt formed in the image forming surface of the projection optical system PL.

(2) In this wavefront aberration measurement apparatus of the projection optical system, using the AF sensor 30 which detects the position of the wafer W relative to the image forming surface of the projection optical system PL, a gap between the projection optical system PL and the incident surface 36*a* of the collimator lens system 37 arranged so as to be faced to the projection optical system PL, can be detected. Therefore, the image forming state of the image of the pattern relative to the incident surface 36*a* can be readily detected by utilizing the AF sensor 30 arranged in the exposure apparatus.

(3) In this wavefront aberration measurement apparatus of the projection optical system, the wavefront aberration measurement unit 35 includes the collimator lens system 37 which converts the light flux which has been transmitted through the projection optical system PL into the parallel beam, the micro lens array 39 which divides the parallel beam into a plurality of light fluxes, and the image pickup element 40 which receives the divided light fluxes. Therefore, the wavefront aberration of the projection optical system PL can be further accurately measured by using the wavefront aberration measurement unit 35 having the simple structure.

(4) In this wavefront aberration measurement apparatus of the projection optical system, the collimator lens system 37 forms the object optical system facing the projection optical system PL. Moreover, the incident surface 36*a* of the collimator lens system 37 is formed to be flat and arranged so as to substantially coincide with the image forming surface of the projection optical system PL. Therefore, the image forming state of the image of the pattern relative to the incident surface 36*a* can be further accurately detected by projecting the slit light onto the incident surface 36*a* of the collimator lens system 37 from the light projection system 30*a* of the AF sensor 30 and receiving the reflected light from the incident surface 36*a* by the light receiving system 30*b*. Thus, the wavefront aberration of the projection optical system PL can be further accurately measured, and the image formation characteristic of the projection light system PL can be further accurately corrected based on the wavefront aberration.

(5) In this wavefront aberration measurement apparatus of the projection optical system, the focal position Fp of the collimator lens system 37 on the projection optical system PL side is set on the incident surface 36*a* of the collimator lens system 37. Accordingly, the wavefront aberration information can be readily calculated without correcting the focal position Fp of the collimator lens system 37.

(6) In this wavefront aberration measurement apparatus of the projection optical system, the wavefront aberration measurement unit 35 is removably arranged on the Z stage 23 on the wafer stage WST. Therefore, the wavefront aberration measurement unit 35 can be attached on the Z stage 23 only when necessary, and the wavefront aberration of the projection optical system PL can be rapidly and accurately measured. Therefore, the structure of the exposure apparatus can be simplified.

A second embodiment according to the present invention will now be described while focusing on parts different from the first embodiment.

In the second embodiment, as similar to the first embodiment, the wafer stage WST is first moved in the direction Y by the wafer stage driving section 26 before measuring the wavefront aberration of the projection optical system PL, and the incident surface 36*a* of the wavefront aberration measurement unit 35 is made to face the optical element which constitutes the projection optical system PL and is positioned closest to the image forming side. Then, although the pin hole PH of the test reticle Rt is irradiated with the measurement light RL, detection of the image forming state of an image of the pattern of the test reticle Rt formed on the incident surface 36*a* of the wavefront aberration measurement unit 35 by using the AF sensor 30 is omitted in this embodiment. In the second embodiment, the measured wavefront aberration information is developed into various kinds of aberration components, i.e., a defocus component, image point movement, an astigmatism, a coma aberration, a spherical aberration or the like based on polynomial equation of Zernike as shown in FIG. 5, and the defocus component is obtained as one component in the developed aberration components.

Subsequently, based on this defocus component, the Z stage 23 is moved in the direction Z by controlling the Z stage driving section 25, and the position of the incident surface 36*a* of the wavefront aberration measurement unit 35 relative to the position of an image of the pattern is adjusted. Then, after this adjustment, as similar to the first embodiment, the wavefront aberration of the projection optical system PL is measured by the wavefront aberration measurement unit 35 and the wavefront aberration detection section 41 with the defocus component being suppressed small.

Incidentally, in this embodiment, calculation of the defocus component, positional adjustment, and measurement of the wavefront aberration may be repeatedly carried out until the defocus component calculated from the wavefront aberration information reaches a predetermined value (for example, the state that the image forming surface of the projection optical system PL substantially coincides with the incident surface 36*a*).

Therefore, according to this embodiment, the following advantage can be obtained in addition to the advantages described in (1), (3), (5) and (6) in the first embodiment.

(7) In this wavefront aberration measurement apparatus of the projection optical system, the wavefront aberration information obtained in the wavefront aberration detection section 41 is developed into various aberration components based on the polynomial equation of Zernike, and the image forming state of an image of the pattern of the test reticle Rt relative to the incident surface 36*a* is detected by using the defocus component which is one component in the developed aberration components. Therefore, the image forming state of the image of the pattern relative to the incident surface 36*a* does not have to be actually detected by using the AF sensor 30 or the like, and the image forming state of the image of the pattern relative to the incident surface 36*a* can be readily obtained based on the defocus component calculated from the wavefront aberration information.

A third embodiment according to the present invention will now be described while focusing on parts different from the first embodiment.

In the third embodiment, as similar to the first embodiment, a focusing state of an image of the pattern relative to the incident surface 36*a*, namely, a displacement of the incident surface 36*a* relative to the image forming surface of the projection optical system PL is first detected by the AF sensor 30. Then, the position of the incident surface 36*a* of the wavefront aberration measurement unit 35 relative to the image forming surface of the projection optical system PL is adjusted based on the detection result of the AF sensor 30, and the wavefront aberration of the projection optical system PL is measured after this adjustment. Alternatively, as similar to the second embodiment, a defocus component is calculated from the information of the previously measured wavefront aberration, the position of an image of the pattern relative to the incident surface 36*a* is adjusted based on the defocus component, and the wavefront aberration of the projection optical system PL is measured after this adjustment.

Subsequently, the information of the measured wavefront aberration is developed into various kinds of aberration components, i.e., a defocus component, image point movement, an astigmatism, a coma aberration, a spherical aberration or the like based on the polynomial equation of Zernike shown in FIG. 5, and the defocus component is obtained as one component in the developed aberration components. Then, based on this defocus component, the position of the incident surface 36*a* of the wavefront aberration measurement unit 35 relative to the image forming surface of the projection optical system PL is adjusted. After this adjustment, the wavefront aberration of the projection optical system PL is measured again by the wavefront aberration measurement unit 35 and the wavefront aberration detection section 41. Then, the information of the thus further measured wavefront aberration is developed into various kinds of aberration components such as a defocus component, image point movement, an astigmatism, a coma aberration, a spherical aberration or the like based on the polynomial equation of Zernike, and the defocus component is obtained from the developed aberration components. Subsequently, based on this defocus component, the position of the incident surface 36*a* of the wavefront aberration measurement unit 35 relative to the image forming surface of the projection optical system PL is again adjusted.

Thereafter, calculation of the defocus component, positional adjustment and measurement of the wavefront aberration mentioned above are repeatedly carried out until the defocus component calculated from the wavefront aberration information reaches a predetermined value (until the image forming surface of the projection optical system PL substantially matches with the incident surface 36*a*). Therefore, the position of the incident surface 36*a* of the wavefront aberration measurement unit 35 relative to the image forming surface of the projection optical system PL can be made highly accurate by repeatedly performing measurement. For example, the effect of a measurement error caused by the positioning accuracy of the Z stage in the direction Z can be reduced.

Therefore, according to the present invention, the following advantages can be obtained in addition to the advantages described in (1) to (7) in each of the foregoing embodiments.

(8) In this wavefront aberration measurement apparatus of the projection optical system, the position of a detection surface of the wavefront aberration measurement unit 35 is changed based on the defocus component calculated from the wavefront aberration information obtained in advance, and the position of an image of the pattern relative to the detection surface can be adjusted. Then, after this adjustment, an image of the pattern is again detected by the wavefront aberration measurement unit 35, and the wavefront aberration information is again obtained by the wavefront aberration detection section 41 based on this detection result. Therefore, the effect of a measurement error caused by the positioning accuracy of the Z stage 23 in the direction Z can be reduced, and the wavefront aberration can be further accurately measured.

It is to be noted that each embodiment according to the present invention may be modified as follows.

A second CCD for measuring a pupil shape of the target optical system may be provided. For example, in FIG. 2, a half mirror is provided between the relay lens 38 and the micro lens array 39, and the second CCD is arranged at the rear of the half mirror so as to provide the positional relationship optically conjugated with the position of the pupil of the target optical system. Providing the second CCD in this manner can match the center of the CCD 40 with the center of the pupil of the projection optical system, thereby obtaining the displacement of a spot image position from the center of the pupil.

In the foregoing embodiments, although the wavefront aberration measurement unit 35 is removably attached to the attachment concave portion 34 of the Z stage 23 on the wafer stage WST, the wavefront aberration measurement unit 35 may be configured to be removably attached to a notch portion provided on the side face or the corner of the Z stage 23.

In addition, the wavefront aberration measurement unit 35 may be directly fixed and arranged on the Z stage 23 or it may be mounted on the Z stage 23 through the wafer holder 24. Incidentally, in this case, the wafer stage WST must be moved along the direction of the optical axis AX of the projection optical system PL when measuring the wavefront aberration of the projection optical system PL, and the incident surface 36*a* of the wavefront aberration measurement unit 35 must coincide with an image surface position of the projection optical system PL.

In a case where such a configuration is achieved, the attachment concave portion 34 does not have to be provided on the wafer stage WST, and there can be obtained an advantage that the structure of the wafer stage WST can be simplified.

In the foregoing embodiments, although the movable mirror 31 is arranged so as to be movable into or from the optical path of the exposure light EL in order to lead the measurement light RL to the projection optical system PL, the measurement light source 33 and the movable mirror 31 may be removably disposed to the illumination optical system 17. In this case, the movable mirror 31 may be of a fixed type. Further, the exposure light EL from the exposure light source 11 may be directly used to measure the wavefront aberration of the projection optical system PL without providing the measurement light source 33.

In this case, there can be obtained the advantage that the peripheral structure of the illumination optical system 17 can be simplified.

In the foregoing embodiments, the Z stage driving section 25 is used to configure the adjustment mechanism for adjusting the position of the incident surface 36*a* of the wavefront aberration measurement unit relative to the image forming surface of the projection optical system PL, but the adjustment mechanism may be constituted by the image formation characteristic control section 52 and the position of the image forming surface of the projection optical system PL may be changed in order to adjust a relative position between the incident surface 36*a* and the image forming surface of the projection optical system PL.

In such a case, the advantages similar to those of the foregoing embodiments can be likewise obtained.

In the foregoing embodiments, the image formation characteristic of the projection optical system PL is adjusted by the image formation characteristic control section 52 and the respective drive elements 50 and 51, but washers or the like having different thicknesses may be selectively fitted between the respective lens elements 44, 46 and 48 in order to conduct adjustment, for example. Furthermore, the projection optical system PL may be accommodated in a plurality of the divided mirror-barrels and distances between the respective mirror-barrels may be changed. Furthermore, the image formation characteristic of the projection optical system PL may be corrected by shifting the wavelength of the exposure light, or moving the reticle R in the direction of the optical axis, or inclining the reticle R with respect to the optical axis.

In such a case, there can be obtained an advantage that the peripheral structure of the projection optical system PL can be simplified.

In the foregoing embodiments, as the optical member for generating the spherical wave SW in the measurement light RL entering the projection optical system PL, the structure using the test reticle Rt having the pin hole PH formed therein has been described. However, the present invention is not restricted to this structure as long as it can generate the spherical wave SW in the measurement light RL. For example, when measuring the wavefront aberration of the projection optical system PL, an opening portion may be formed on the reticle stage RST in place of the test reticle Rt, and a pin hole PH pattern may be formed on a transparent plate attached so as to close the opening portion. Besides, the similar pin hole PH pattern may be formed in an ordinary device reticle. Moreover, the similar pin hole PH pattern may be formed in the reticle stage RST itself.

In addition, the wavefront aberration information may be measured at a plurality of positions in the illumination area of the projection optical system, and a relative position between the incident surface 36*a* of the wavefront aberration measurement unit 35 and the image forming surface of the projection optical system PL may be adjusted based on the wavefront aberration information.

Although the pulse light of the excimer laser beam is used as the exposure light EL in the foregoing embodiments, a higher harmonic wave of the metal vapor laser or the YAG laser, or continuous light such as emission light of an ultra-high pressure mercury lamp, for example, a g-ray, an h-ray or an I-ray may be adopted as the exposure light EL, for example. In such a case, the power of the measurement light RL can be reduced, and the durability of the pin hole pattern can be further improved. Incidentally, in a case where the exposure light in a far ultraviolet wavelength band or a vacuum ultraviolet wavelength band is used as the exposure light EL, for example, when the ArF excimer laser beam or the $F_2$ laser beam described in this embodiment is used, it is desirable that the optical path space of the exposure light EL is cut off from the outside air and a gas replacement mechanism which performs gas replacement in the optical path space with a gas (an inert gas or a rare gas) through which the exposure light EL is transmitted is provided. In addition, it is desirable to cut off the inside of the wavefront aberration measurement apparatus from the outside air and provide the gas replacement mechanism which performs gas replacement with an inert gas or a rare gas. By such gas replacement, absorption of the exposure light by an organic matter or a light absorbing substance can be reduced, and the wavefront aberration of the target optical system can be measured with the stable illumination.

Although the measurement light RL is determined as a higher harmonic wave of the DFB semiconductor laser or the fiber laser in the foregoing embodiments, an ultraviolet light beam, a visible light beam or an infrared light beam emitted from, for example, a rare gas discharge lamp such as an argon lamp, a krypton lamp or a xenon lamp, a xenon-mercury lamp, a halogen lamp, a fluorescent lamp, an incandescent lamp, a mercury lamp, a sodium lamp or a metal halide lamp, or a higher harmonic wave of the light obtained from realizing the single wavelength of such light beams, or a higher harmonic wave of an YAG laser beam or a metal vapor laser beam may be adopted as the measurement light RL.

Although the foregoing embodiments adopt the method for measuring the aberration of the projection optical system PL as the wavefront aberration by the Shack-Hartmann system, a so-called PSF (point spread function) system which obtains the wavefront aberration of the projection optical system PL from the optical image complex amplitude distribution by the phase retrieval method may be employed.

Although the projection optical system PL of the exposure apparatus is embodied as a target optical system for measurement of the wavefront aberration in the foregoing embodiments, it may be embodied in the wavefront aberration measuring instrument of any other optical system such as an illumination optical system or the like in the exposure apparatus or an optical system in an optical apparatus different from the exposure apparatus.

Although the present invention is embodied in the exposure apparatus which is of the scanning exposure type for manufacturing a semiconductor element in the foregoing embodiments, it may be embodied in the exposure apparatus which performs collective exposure based on the step-and-repeat system, for example. Additionally, it may be embodied in the exposure apparatus for manufacturing a micro device such as a liquid crystal display element, an image pickup element or a thin-film magnetic head or the exposure apparatus for manufacturing a photo mask such as a reticle.

Further, the projection optical system is not restricted to one in which all optical elements are refractor type lenses, and it may be constituted by a reflection element (mirror) or it may be of a catadioptric type consisting of a refractive lens and a reflection element. Furthermore, the projection optical system is not restricted to a reduction system, and it may be an equal power system or a magnification system.

Incidentally, the illumination optical system 17 constituted by a plurality of lenses and the projection optical system PL are incorporated in the exposure apparatus main body and optical adjustment is carried out, the reticle stage RST consisting of a plurality of mechanical components or the wafer stage WST is attached to the exposure apparatus main body and wirings or tubes are connected, and comprehensive adjustment (electrical adjustment, operation confirmation or the like) is carried out, thereby manufacturing the exposure apparatus according to the foregoing embodiments. It is desirable to manufacture the exposure apparatus in a clean room in which a temperature, a degree of cleanness and others are controlled.

As a vitreous material of the respective lenses 12, 13*a*, 13*b* and 16 of the illumination optical system 17 and the respective lens elements 44, 46 and 48 of the projection optical system PL in the foregoing embodiment, it is possible to apply a crystal such as lithium fluoride, magnesium fluoride, strontium fluoride, lithium-calcium-aluminum-fluoride, and lithium-strontium-aluminum-fluoride, or glass fluoride consisting of zirconium-barium-lanthanum-aluminum, or improved quartz such as quartz glass obtained by doping fluorine, quartz glass having hydrogen doped in addition to fluorine, quartz glass containing an OH group, or quartz glass containing the OH group in addition to fluorine as well as fluorite or quartz.

Description will now be given of a method for manufacturing a micro device (hereinafter simply referred to as a "device"), in which the above-described exposure apparatus is used in a lithography step.

Figure 6:
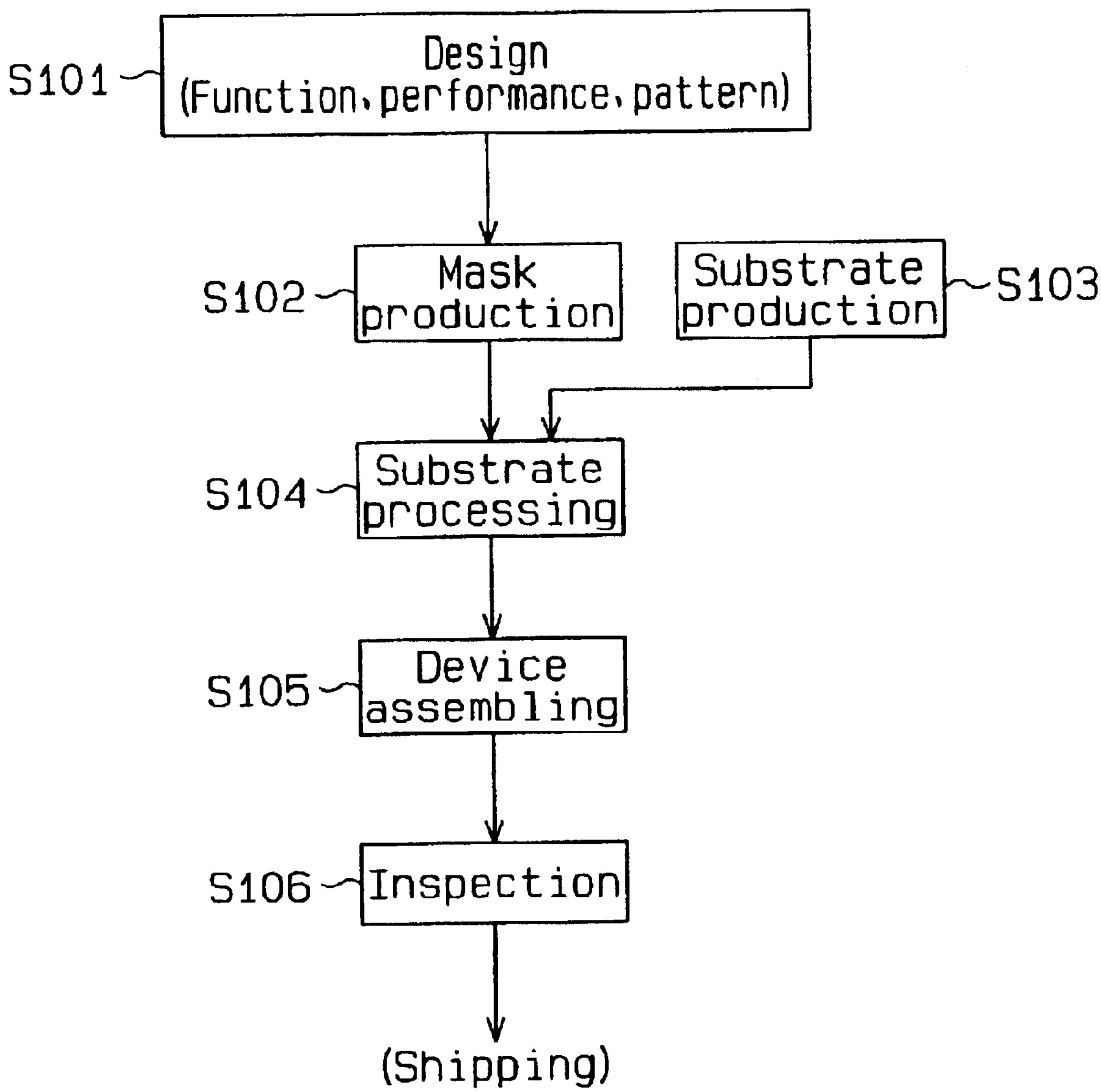
FIG. 6 is a flowchart of an example of manufacturing a micro device.

FIG. 6 is a flowchart showing an example of manufacturing a device (a semiconductor element such as an IC or an LSI, a liquid crystal display element, an image pickup element (CCD or the like), a thin-film magnetic head, a micro machine and others). As shown in FIG. 6, in step S101 (design step), function/performance design of a device (for example, circuit design of a semiconductor device or the like) is first carried out, and pattern design for realizing the function is conducted. Subsequently, in step S102 (mask production step), a mask having the designed circuit pattern formed therein (reticle R or the like) is manufactured. On the other hand, in step S103 (substrate production step), a substrate (wafer W when a silicon material is used) is manufactured by using a material such as silicon or a glass plate.

Then, in step S104 (substrate processing step), the mask and the substrate prepared in steps S101 to S103 are used, and an actual circuit or the like is formed on the substrate by using the lithography technique or the like as will be described later. Thereafter, in step S105 (device assembling step), the substrate processed in step S104 is used and device assembling is carried out. This step S105 includes processes such as a dicing process, a bonding process, and a packaging process (chip encapsulation or the like) as necessary.

Finally, in step S106 (inspection step), an inspection such as an operation confirmation test, a durability test or the like of the device manufactured in step S105 is carried out. After these steps, the device is completed and this is shipped.

Figure 7:
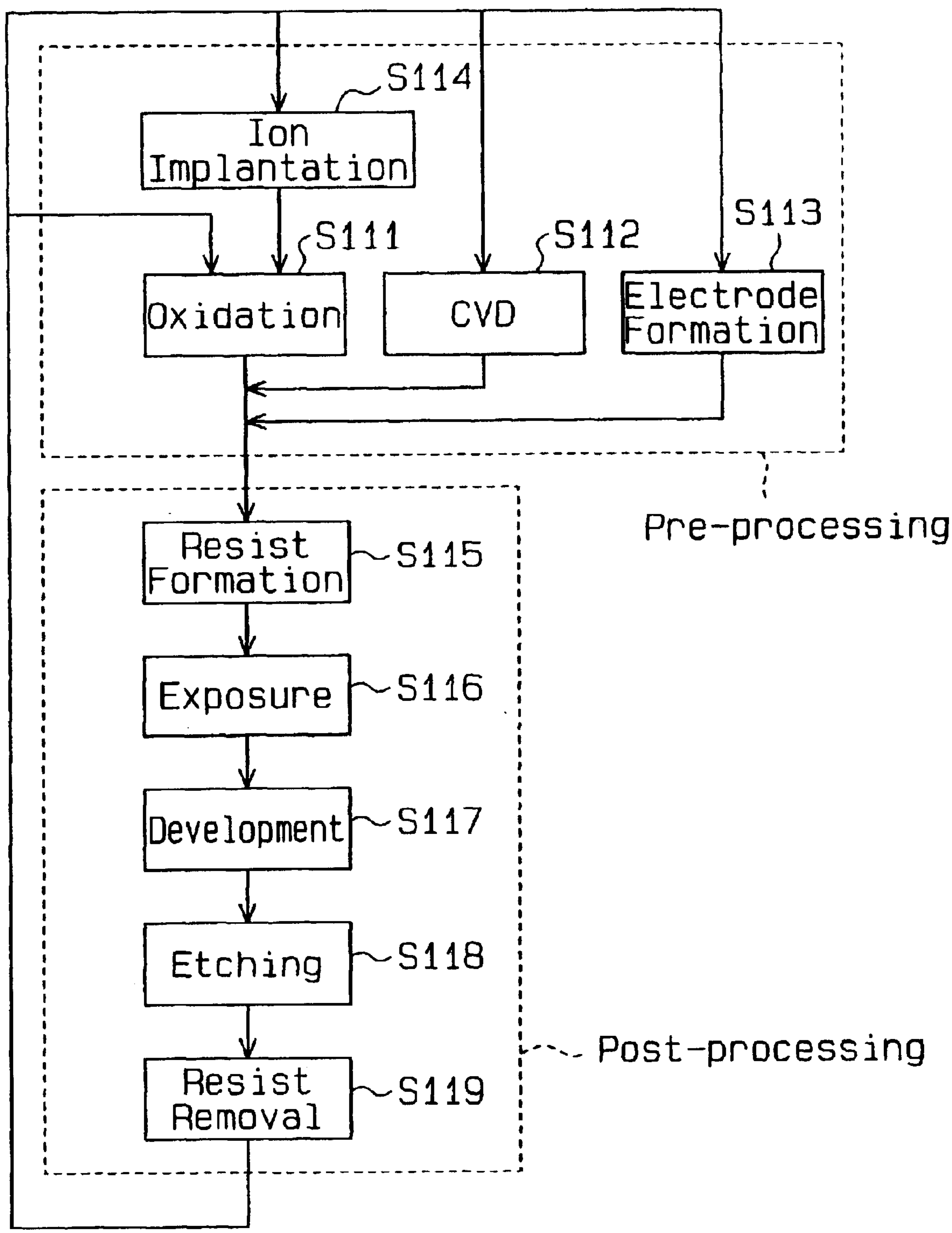
FIG. 7 is a detailed flowchart of a substrate treatment in FIG. 6 in case of a semiconductor element.

FIG. 7 is a view showing an example of a detailed flow of the step S104 in FIG. 6 in case of the semiconductor device. In FIG. 7, in step S111 (oxidation step), the surface of the wafer W is oxidized. In step S112 (CVD step), an insulating film is formed on the surface, of the wafer W. In step S113 (electrode formation step), an electrode is formed on the wafer W by vapor deposition. In step S114 (ion implantation step), ion is implanted in the wafer W. Each of the above-described steps S111 to S114 constitutes a pre-processing step of each stage of wafer processing, and these steps are selected and executed in accordance with processing required at each stage.

At each stage of the wafer process, upon completing the above-described pre-processing step, a post-processing step is executed as follows. In the post-processing step, in step S115 (resist formation step), a sensitizing agent is first applied on the wafer W. Subsequently, in step S116 (exposure step), the circuit pattern of the mask (reticle R) is transferred on the wafer W by the above-described lithography system (exposure apparatus). Then, the exposed wafer W is developed in step S117 (development step), and the exposed member at portions other than a portion on which the resist remains is removed by etching in step S118 (etching step). Further, in step S119 (resist removal step), the resist which is no longer necessary after etching is removed.

The multiple layers of the circuit pattern are formed on the wafer W by repeatedly carrying out the pre-processing step and the post-processing step.

By utilizing the device manufacturing method according to this embodiment mentioned above, the exposure apparatus is used in the exposure process (step S116), and the resolving power can be improved by the exposure light EL in the vacuum ultraviolet band, and an amount of exposure can be highly accurately controlled. Therefore, as a result, a device whose minimum line width is approximately 0.1 μm and which has a high degree of integration can be produced in good yield.

Industrial Applicability

According to the present invention, there are provided an apparatus and a method which can measure a wavefront aberration of a target optical system with the improved measurement accuracy. According to the apparatus and the method of the present invention, since the image formation characteristic of the projection optical system is accurately corrected based on the measured wavefront aberration, exposure with high accuracy is enabled, and the micro device with high accuracy can be manufactured.

What is claimed is:

1. A wavefront aberration measuring instrument comprising:

a wavefront aberration sensor which obtains wavefront aberration information of an optical system, develops the wavefront aberration information by using Zernike polynomials, and calculates a defocus component; and an adjustment mechanism which is connected with the wavefront aberration sensor and adjusts a position of the wavefront aberration sensor based on the calculated defocus component, wherein after the position of the wavefront aberration sensor is adjusted, the wavefront aberration sensor obtains again wavefront aberration information of the optical system, develops the again obtained wavefront aberration information by using the Zernike polynomials, and calculates a plurality of aberration components including the defocus component.

2. The wavefront aberration measuring Instrument according to claim 1, wherein the wavefront aberration sensor includes an incident surface on which a light flux passed through the optical system is incident, and the adjustment mechanism adjusts a position of the incident surface based on the defocus component.

3. The wavefront aberration measuring instrument according to claim 2, wherein the adjustment mechanism adjusts the position of the incident surface until the defocus component reaches a predetermined value.

4. The wavefront aberration measuring instrument according to claim 1, wherein the plurality of aberration components includes an astigmatism component, a coma aberration component, and a spherical aberration component.

5. The wavefront aberration measuring instrument according to claim 4, further comprising a control apparatus, which is connected with an optical characteristic adjustment apparatus and controls the optical characteristic of the optical system based on the calculated aberration components.

6. The wavefront aberration measuring instrument according to claim 1, wherein the optical system is a projection optical system that projects a pattern formed on a mask onto a substrate, and the wavefront aberration sensor is mounted on a substrate stage which holds the substrate.

7. The wavefront aberration measuring instrument according to claim 6, wherein the wavefront aberration sensor is removably mounted to the substrate stage.

8. The wavefront aberration measuring instrument according to claim 6, further comprising a pin hole pattern arranged at an object surface side of the optical system.

9. The wavefront aberration measuring instrument according to claim 8, wherein the pin hole pattern is disposed on a mask stage which holds the mask.

10. The wavefront aberration measuring instrument according to claim 9, wherein the pin hole pattern is formed in a test reticle that is removably mounted on the mask stage.

11. The wavefront aberration measuring instrument according to claim 9, wherein the pin hole pattern is formed in a pattern plate that is disposed on an opening portion of the mask stage.

12. An exposure apparatus which projects a pattern formed on a mask onto a substrate through a projection optical system, wherein the exposure apparatus comprises the wavefront aberration measuring instrument as set forth in claim 6.

13. The exposure apparatus according to claim 12, wherein the wavefront aberration sensor includes an incident surface that is incident a light flux passed through the projection optical system, and the exposure apparatus further comprising:

an auto focusing mechanism that detects the incident surface of the wavefront aberration sensor with respect to the image surface of the projection optical system.

14. The exposure apparatus according to claim 13, wherein after a position of the incident surface of the wavefront aberration sensor with respect to the image surface of the projection optical system is adjusted based on the detected result of the auto focusing mechanism, the wavefront aberration sensor obtains wavefront information of the projection optical system.

15. The wavefront aberration measuring instrument according to claim 1, wherein the wavefront aberration sensor includes an optical member that converts a light flux passed through the optical system into a parallel beam, an micro lens array that divides the parallel beam into a plurality of light fluxes, and a light receiving mechanism that receives the divided light fluxes.

16. An exposure apparatus which projects a pattern formed on a mask onto a substrate through a projection optical system, the exposure apparatus comprising:

a substrate stage arranged at an image surface side of the projection optical system;

a wavefront aberration sensor mounted on the substrate stage, wherein the wavefront aberration sensor obtains wavefront aberration information of the projection of the projection optical system, develops the wavefront aberration information by using Zernike polynomials, and calculates a defocus component; and an adjustment mechanism which is connected with the substrate stage and adjusts a position of the substrate stage based on the calculated defocus component, wherein after the position of the substrate stage is adjusted, the wavefront aberration sensor obtains again wavefront aberration information of the projection optical system, develops the again obtained wavefront aberration information by using the Zernike polynomials, and calculates a plurality of aberration components including the defocus component.

17. The wavefront aberration measuring instrument according to claim 16, wherein the wavefront aberration sensor includes an incident surface on which a light flux passed through the projection optical system is incident, and wherein the exposure apparatus further comprises;

an auto focusing mechanism that detects the incident surface of the wavefront aberration sensor with respect to the image surface of the projection optical system.

18. The exposure apparatus according to claim 17, wherein after the position of the incident surface with respect to the image surface is adjusted, the wavefront aberration sensor obtains wavefront information of the projection optical system.

19. The exposure apparatus according to claim 17, further comprising an optical characteristics adjustment apparatus disposed in the projection optical system, wherein the optical characteristics adjustment apparatus controls an optical characteristics of the projection optical system based on the calculated the plurality of the aberration components.

20. The exposure apparatus according to claim 17, further comprising a pin hole pattern arranged at an object surface side of the projection optical system.

21. A method for manufacturing a micro device, the method comprising:

using an exposure apparatus which projects a pattern formed on a mask onto a substrate through a projection optical system, wherein the exposure apparatus includes a substrate stage arranged at an image surface side of the projection optical system; a wavefront aberration sensor mounted on the substrate stage, wherein the wavefront aberration sensor obtains wavefront aberration information of the projection of the projection optical system, develops the wavefront aberration information by using Zernike polynomials, and calculates a defocus component; and an adjustment mechanism which is connected with the substrate stage and adjusts a position of the substrate stage based on the calculated defocus component, wherein after the position of the substrate stage is adjusted, the wavefront aberration sensor obtains again wavefront aberration information of the projection optical system, develops the again obtained wavefront aberration information by using the Zernike polynomials, and calculates a plurality of aberration components including the defocus component.

22. A wavefront aberration measuring method comprising:

obtaining wavefront aberration information of an optical system by using a wavefront aberration sensor;

calculating a defocus component by developing the wavefront aberration information by using Zernike polynomials;

adjusting a position of the wavefront aberration sensor based on the calculated defocus component;

obtaining again wavefront aberration information of the optical system after the position of the wavefront aberration sensor is adjusted;

calculating a plurality of aberration components including the defocus component by developing the again obtained wavefront aberration information by using the Zernike polynomials.

23. The wavefront aberration measuring method according to claim 22, wherein the wavefront aberration sensor includes an incident surface on which a light flux passed through the optical system is incident, and the position of the incident surface is adjusted based on the defocus component.

24. The wavefront aberration measuring method according to claim 23, wherein the position of the incident surface is adjusted until the defocus component reaches a predetermined value.

25. The wavefront aberration measuring method according to claim 22, wherein the plurality of aberration components includes an astigmatism component, a coma aberration component, and a spherical aberration component.

26. The wavefront aberration measuring method according to claim 25, further comprising:

adjusting an optical characteristic of the optical system based on the calculated aberration components.

27. The wavefront aberration measuring method according to claim 26, wherein the optical system is a projection optical system that projects a pattern formed on a mask onto a substrate.

28. The wavefront aberration measuring method according to claim 22, further comprising:

arranging a pin hole pattern at an object surface side of the optical system.

* * * * *